(12) United States Patent
Chen et al.

(10) Patent No.: US 7,276,739 B2
(45) Date of Patent: Oct. 2, 2007

(54) LOW THERMAL RESISTANCE LIGHT EMITTING DIODE

(75) Inventors: Chen-Lun Hsin Chen, 3F., No. 21, Alley 15, Bainian 2nd St, Longtime, Tauyuan (TW); Hsu-Keng Tseng, Taipei (TW); Jung-Hao Hung, Taipei (TW)

(73) Assignee: Chen-Lun Hsin Chen, Tauyuan (TW)

( * ) Notice: Subject to any disclaimer, the term of this patent is extended or adjusted under 35 U.S.C. 154(b) by 0 days.

(21) Appl. No.: 11/194,704

(22) Filed: Aug. 2, 2005

(65) Prior Publication Data

US 2005/0269591 A1    Dec. 8, 2005

(30) Foreign Application Priority Data

Nov. 3, 2004    (TW)    ............................. 93133561 A (51) Int. Cl.
*H01L 29/22*    (2006.01)
*H01L 33/00*    (2006.01)

(52) U.S. Cl. ................................. 257/99; 257/E33.058
(58) Field of Classification Search .................. 257/99, 257/81, 98, 100
See application file for complete search history.

(56) References Cited

U.S. PATENT DOCUMENTS

| | | | | |
|---|---|---|---|---|
| 4,135,027 | A * | 1/1979 | Anthony et al. | 428/195.1 |
| 5,394,298 | A * | 2/1995 | Sagisaka | 361/704 |
| 5,925,898 | A * | 7/1999 | Spath | 257/98 |
| 6,310,364 | B1 * | 10/2001 | Uemura | 257/100 |
| 6,335,548 | B1 * | 1/2002 | Roberts et al. | 257/98 |
| 6,617,617 | B2 * | 9/2003 | Takekuma et al. | 257/99 |
| 6,819,040 | B2 * | 11/2004 | Parsapour et al. | 313/479 |
| 6,858,869 | B2 * | 2/2005 | Fujiwara | 257/79 |
| 6,922,424 | B2 * | 7/2005 | Weigert et al. | 372/43.01 |
| 6,936,855 | B1 * | 8/2005 | Harrah | 257/88 |
| 2004/0176509 | A1 * | 9/2004 | Hsien | 524/398 |
| 2004/0245591 | A1 * | 12/2004 | Wang et al. | 257/433 |
| 2005/0110034 | A1 * | 5/2005 | Fujiwara | 257/98 |
| 2006/0027829 | A1 * | 2/2006 | Wang et al. | 257/99 |
| 2006/0097276 | A1 * | 5/2006 | Chen et al. | 257/99 |

* cited by examiner

*Primary Examiner*—Evan Pert
*Assistant Examiner*—Benjamin P. Sandvik
(74) *Attorney, Agent, or Firm*—H. C. Lin Patent Agent (57) ABSTRACT

A light emitting diode (LED) includes a LED chip, which can transfer electrical power to electric-magnetic wave. A set of lead frame is enclosed by electrical isolator material to form a cavity. An optics lens seats on top of the cavity and is bonded to said electrical isolator material. A submount to carry said LED chip is soldered or adhered to the lead frame and forms the electrical contact from said LED chip to lead frame. A high transparency material is utilized to enclosed the LED chip.

7 Claims, 8 Drawing Sheets

LOW THERMAL RESISTANCE LIGHT EMITTING DIODE

BACKGROUND OF THE INVENTION

1. Field of the Invention

This invention relates to light emitting diodes (LED), particularly to the packaging of LED for low thermal resistance.

2. Brief Description of Related Art

Figure 1:
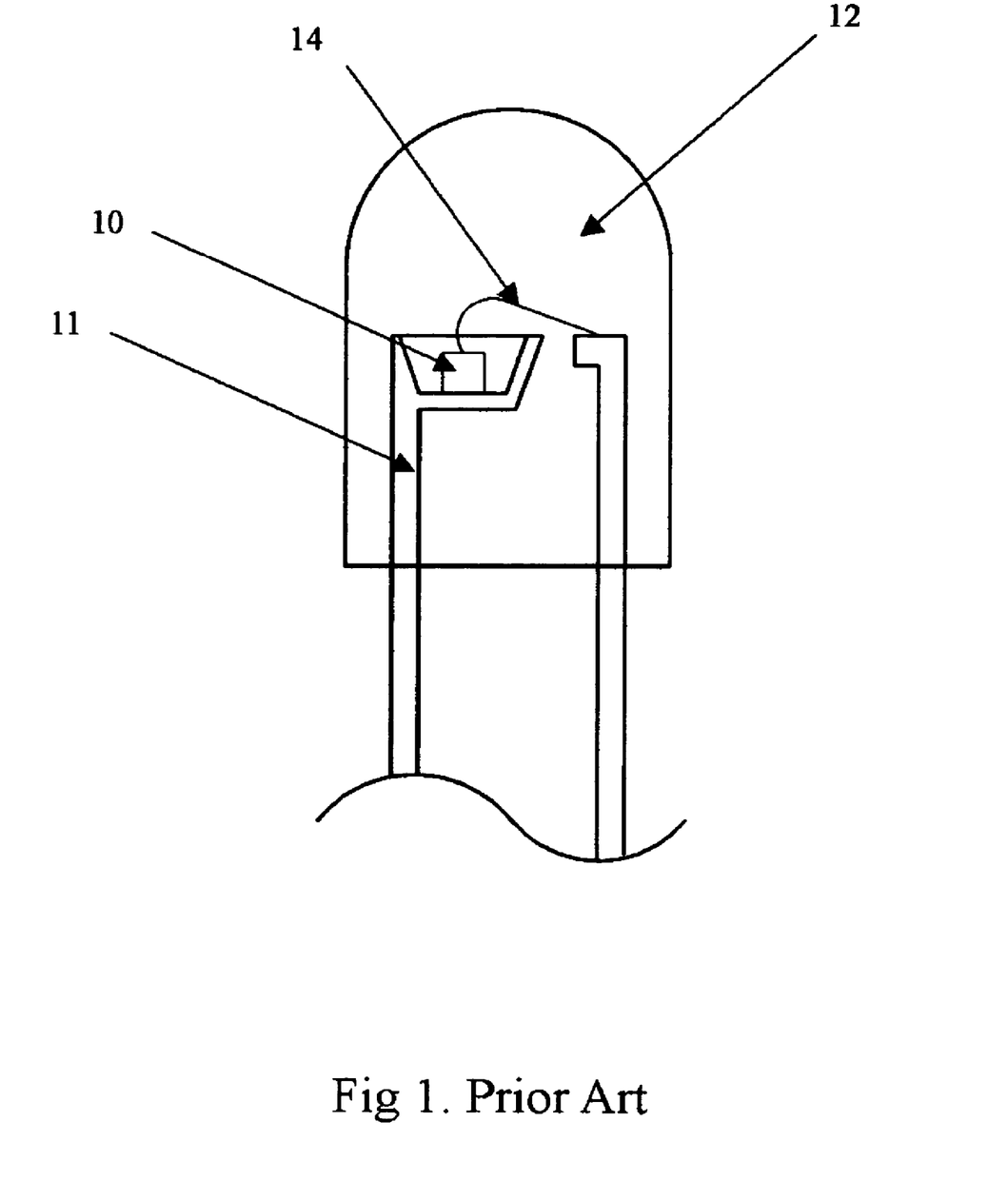
FIG. 1 shows a prior art LED package.

A traditional LED package is shown in FIG. 1. A LED chip 10 is mounted in a recess of a lead frame 11. The recess reflects the light emitted from the LED chip 10. The LED 10 is wire bonded with a gold wire or an aluminum wire 14 to another lead frame 11 to serve as a second terminal for the LED 10. The LED 10 is coated with transparent glue, leaving only the leads exposed for external connection. Such a LED package is widely used for traffic signal lights, signal lights in a car, and indicators in an electronic production line.

Figure 2:
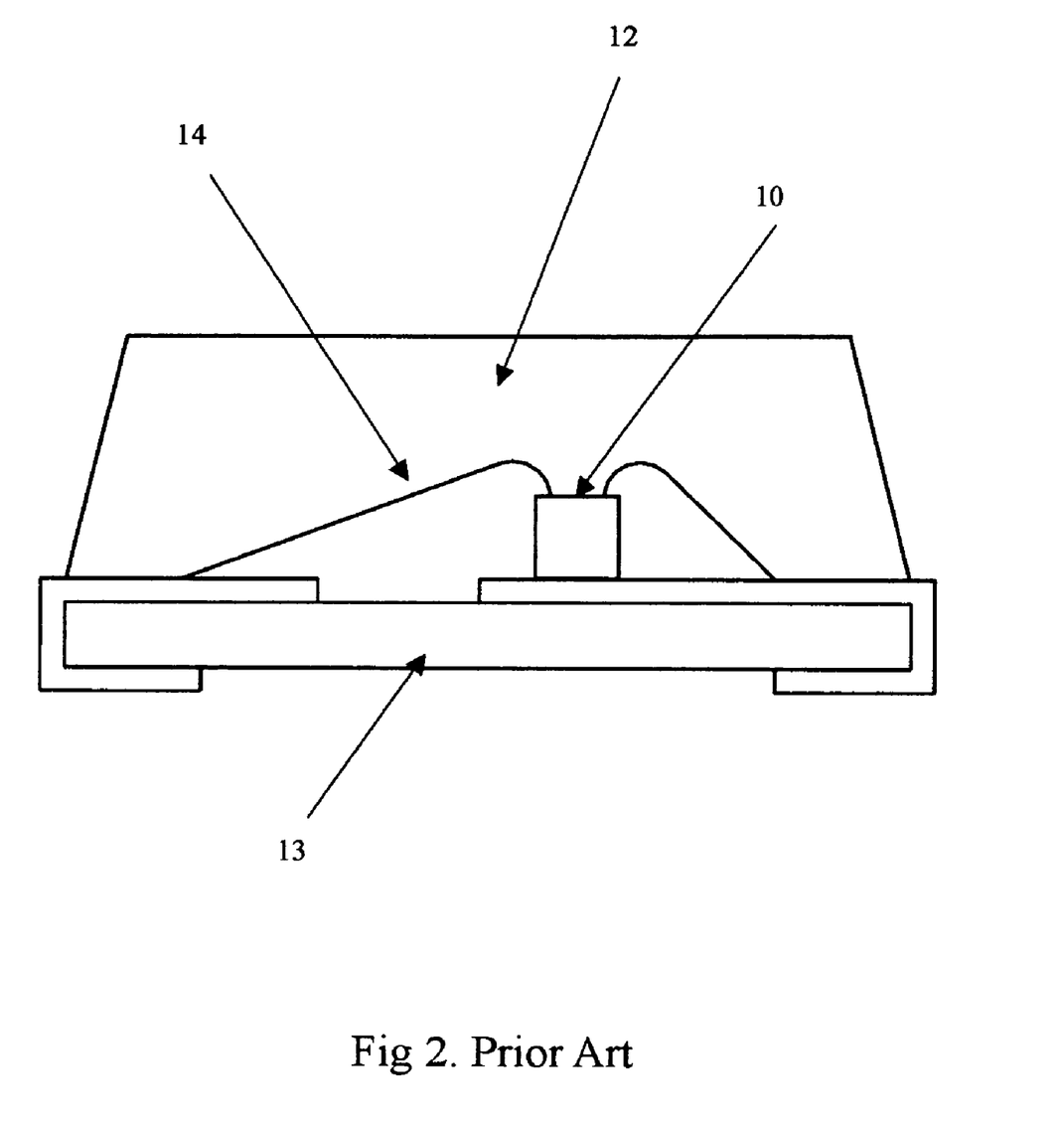
FIG. 2 shows a second prior LED package.

Another prior art is shown in FIG. 2. A LED chip 10 is mounted on a printed circuit board 13, and is wire bonded with gold or aluminum wire 14 to surface contact leads of the printed circuit board. The structure is covered with transparent glue 12. Phosphorescent powder may be added to the glue to produce white light.

The forgoing structures have the shortcoming that the chip is coupled with bonded wires. Such bonding wires all have some degree of pliancy and strength, and widely used for semiconductor packaging. Due to the high price of gold, the cost is substantial in production. In consideration of the area and light transmission, the bonding wire is usually limited to 0.8 to 1.5 mils in diameter. The stress, which such wires can withstand, is limited, especially for the currently popular lead-free solder bonding. The stress produced by the lead-free solder bonding causes higher temperature at the bond, which, in turn, may cause breakage. It is therefore desirable to eliminate the use of bonding wire.

These two structures all have the drawback that the thermal resistance is excessive. Since the chip is a source of heat. When heating sinking is inadequate, the LED chip temperature rises, shortens the life of the LED, reduces the brightness of the light, and even causes the light source to be ineffective. Therefore, the heat removal or heat sinking of the LED is an important consideration for the LED package.

In general, the heat sinking property of a LED package is determined by its thermal resistance. Since the heat source of the package is solely from the LED chip, we often use the path from the P-N junction of the LED to the package lead to define the thermal resistance $R\theta_{J-P}$. It is the thermal resistance from the junction to the lead pin. Mathematically, $$R\theta_{J-P}=(T_J-T_P)/Q$$

where $T_J$ is the light emitting diode junction temperature, $T_P$ is the lead line temperature, Q is the heat flux.

Since the light emitting diode chip is the sole source of heat generation, and only a negligible amount of this energy is radiated as electromagnetic waves, the bulk of the energy is transformed into heat. Thus the thermal-resistance formula can be rewritten as:

$$R\theta_{J-P}=(T_J-T_P)/(I_f*V_f)$$

where $I_f$ is the operating current of the LED and $V_f$ is the operating voltage. Since the pin temperature is determined by the ambient temperature of the system and is not affected by the heat sinking property of the LED, one can see from the foregoing formula that the junction temperature increases with increasing thermal resistance.

From the standpoint of conduction heat transfer, the thermal resistance can be expressed as:

$$R\theta=L/(K\times A),$$

where L is the length of the heat conduction path, K is the thermal conductivity coefficient, and A is cross-sectional area of the heat conduction path.

Thus, we can see that the longer the heat conduction path, the smaller the cross-sectional area and lower the thermal conductivity coefficient, the higher is the thermal resistance. Therefore, for low thermal resistance design, it is important to shorten the heat conduction path, to increase its cross-sectional area and to select a material with high thermal conductivity coefficient.

The foregoing two prior art LED packages essentially dissipate the heat through the lead frame or the printed circuit board. The printed circuit board shown in prior art FIG. 2 is made of plastic material, which has a very low thermal conductivity coefficient, and is incapable of dissipating heat. The printed copper wire on the circuit board has only a thickness of tens and hundreds um with small cross-sectional area Hence, the thermal resistance is very high, ranging 500-1000 K°/Watt. When the energy is high, the LED can easily be overheated. For the prior art described in FIG. 1, the heat path through the support frame of copper or iron. Although the heat conductivity coefficient is good, the cross-sectional area is still very small, ranging 150-250 K°/W. Thus the load current can only be approximately 30 mA.

Figure 3:
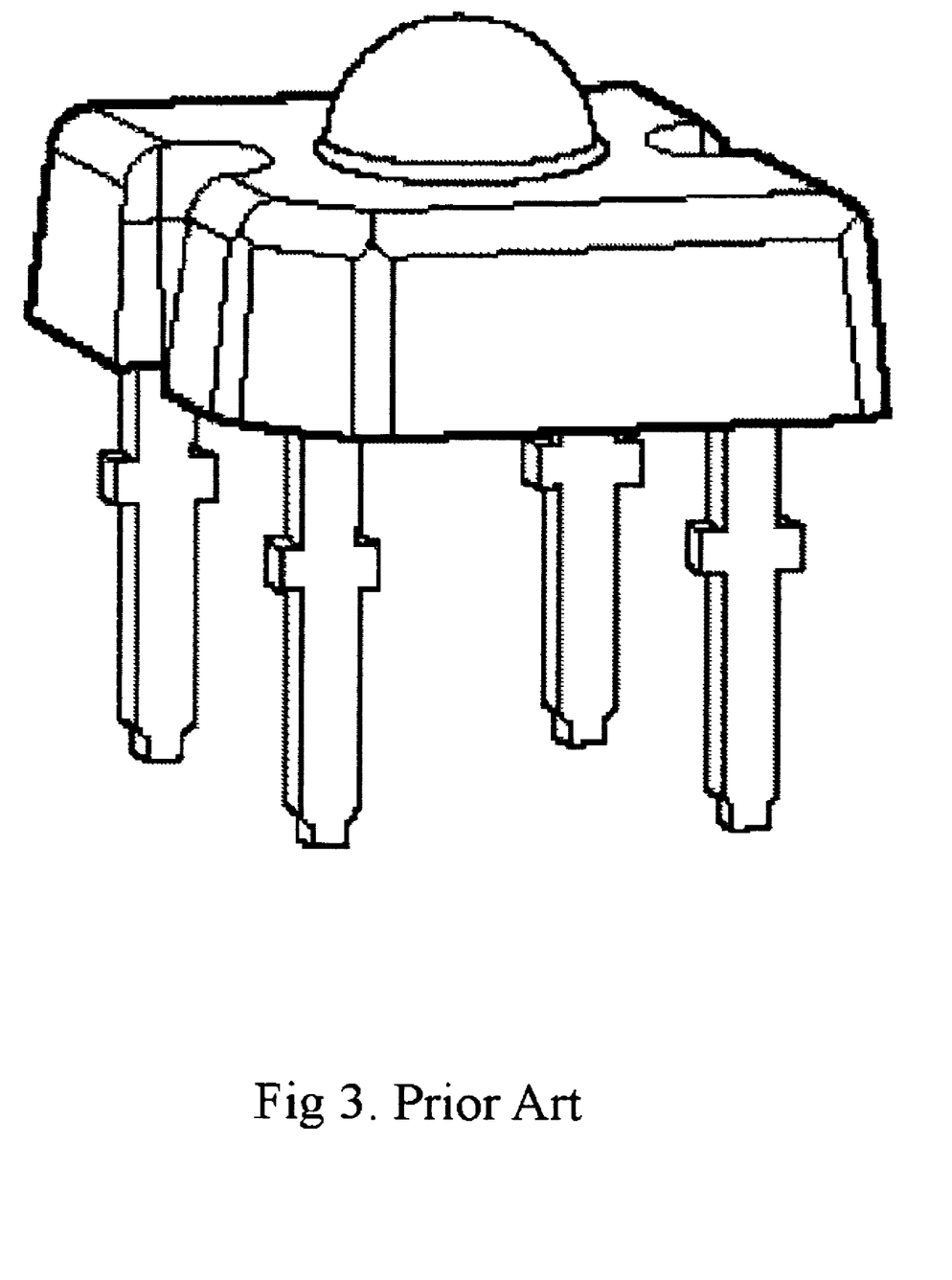
FIG. 3 shows a third prior art LED package.

To remedy this problem, other approaches have been suggested. FIG. 3 shows a design with enlarged pins to reduce the thermal resistance However, the conduction path is long and can only achieve a thermal resistance of 50-75 K °/W.

Figure 4:
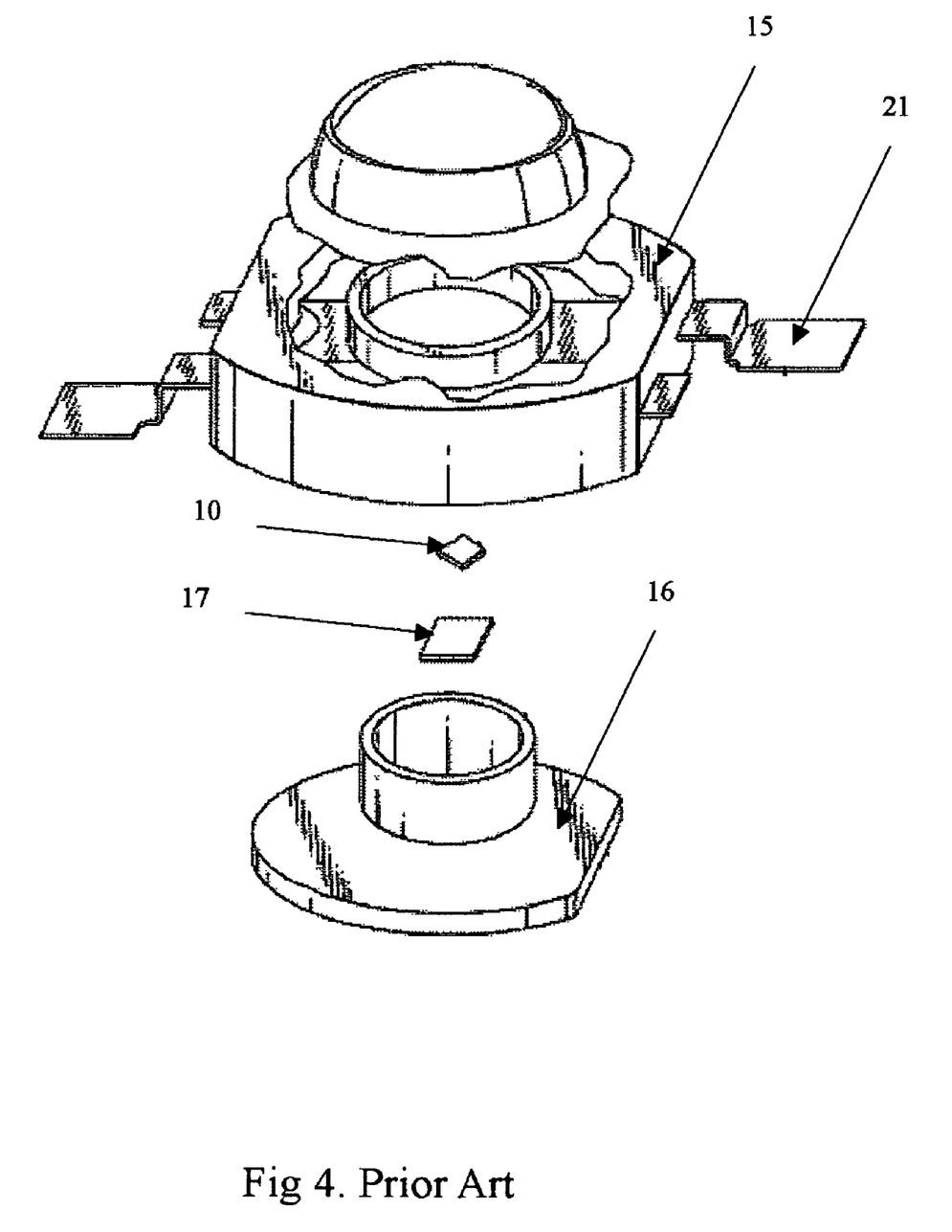
FIG. 4 shows a fourth prior art package as shown in U.S. Pat. No. 6,274,924.

Another invention disclosed in U.S. Pat. No. 6,274,924 and shown in FIG. 4. A set of lead frame 21) is imbedded in an insulating mold 15. Inside the mold 15 is a conduit which has an enlarged flange 16 serving a heat sink. The LED chip 10 is mounted on a submount 17 which is attached to the heat sink, serving as buffer for different expansion coefficients between the chip and the flange 16. The top electrodes of the LED are wire bonded to the lead frame. The heat sink reduces the heat conduction path and enlarges the cross-sectional area to reduce the thermal resistance to 10-15 K °/W. However, from a production stand point, the additional heat sink increases the production processing step and the height of the package. Another problem is that when large LED chips are used, the packaging area need to be increased. An increase in packaging area increases the stress caused by different expansion coefficients, and the danger of breaking the bonding wire also increases.

SUMMARY OF THE INVENTION

An object of this invention is to reduce the thermal resistance of a LED package. Another object of this invention is to reduce the production cost of LED package by reducing the thickness of the package. Still another object of this invention is to increase the reliability of the LED package by reducing the length of or eliminating the bonding wire.

These objects are achieved by using lead frames which are embedded in a mold of insulating material. The mold forms a cavity, in which a LED chip is mounted on a submount with a larger thermal conductivity such as silicon material with printed wiring on it and without using wire-bonding for connection to the LED electrodes to the lead frame. A high transparent material covers the LED chip, and may form a lens for the LED.

DETAILED DESCRIPTION OF THE INVENTION

The present invention provides a LED package with low thermal resistance, simple processing, and high reliability. With low thermal resistance, the package can be used for high efficiency operation, increasing the traditional current capacity of 20 mA to 350 mA or more. Due to simplicity in structure, the material cost and production is lowered. Due to high reliability, the package is suitable for hostile environment such as that in cars, airplanes, big screen back light, and high temperature ambient, lead-free processing, etc.

Figure 5:
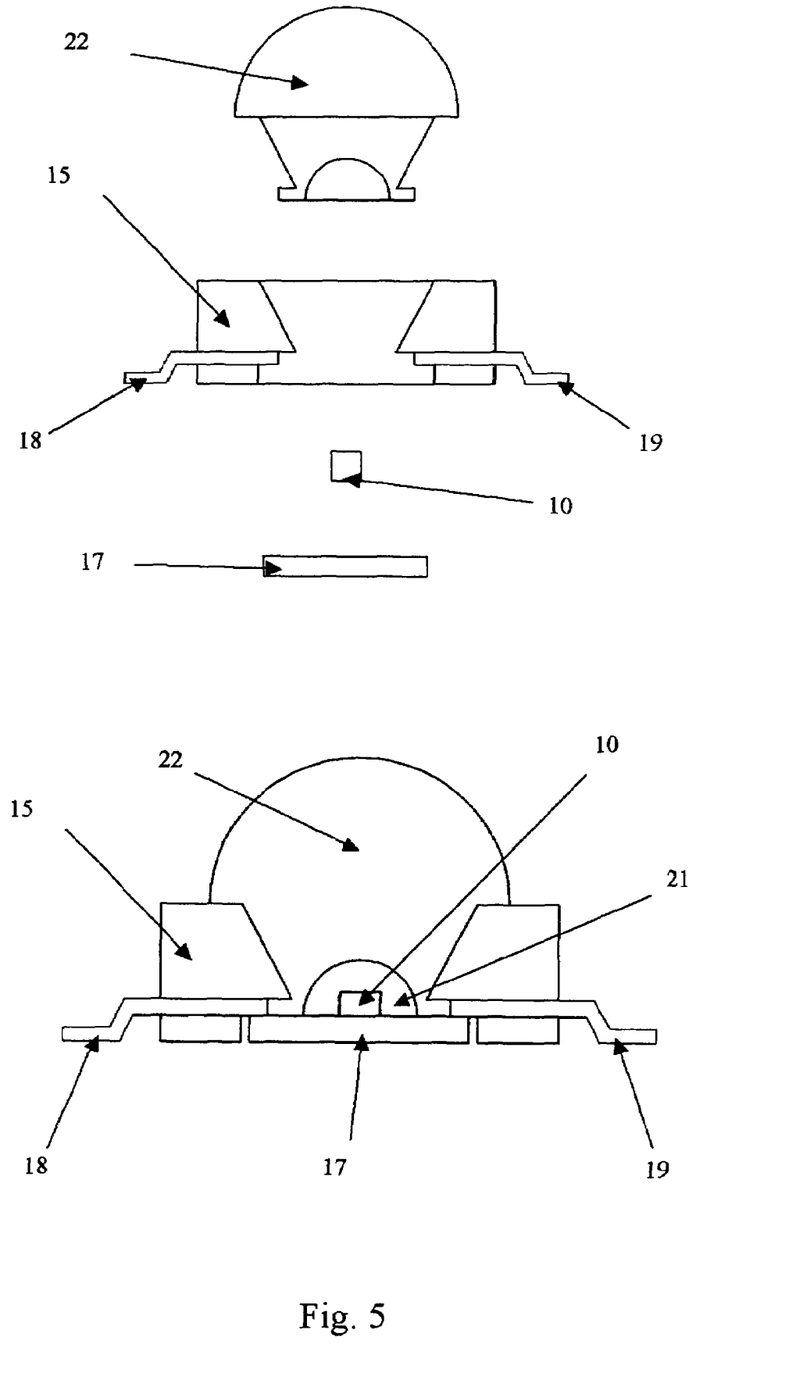
FIG. 5 shows the basic structure for a LED package of the present invention.
Figure 6:
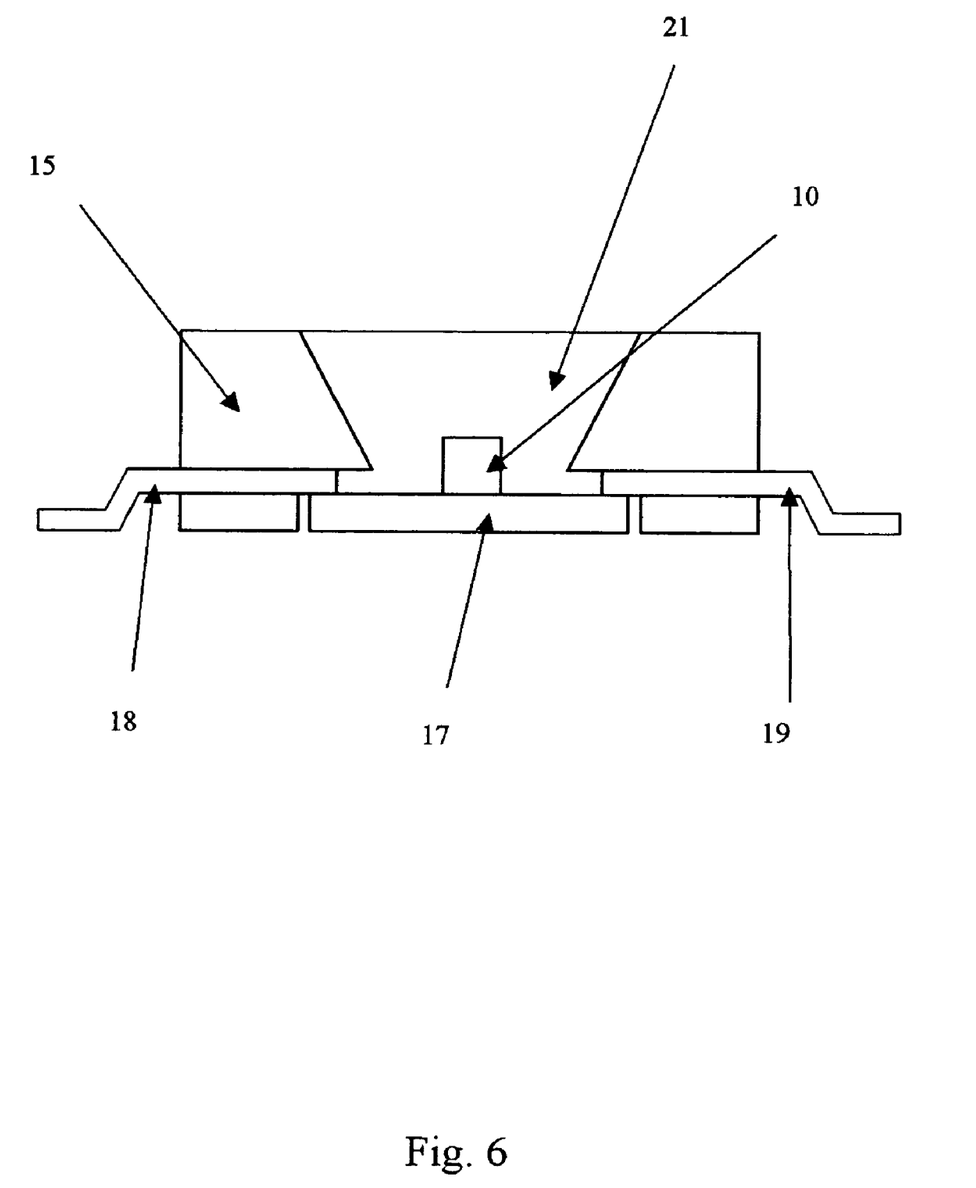
FIG. 6 shows a second embodiment of a LED package of the present invention.

FIG. 5 shows the first embodiment of the present invention. A metal sheet is punched out by a press into two lead frames for positive lead 18 and negative lead 19. The lead frames are embedded in a mold of insulating epoxy 15. The positive lead frame 18 and the negative lead frame are exposed inside the core or cavity of the mold 15. A plastic transparent lens 22 is mounted on top of the cavity 15 using transfer molding. The lens typical has at least transmission coefficient of 70% at a wavelenth of 550 nm. The lead frames 18 and 19 have exposed sections without insulating covering. The bottom of the mold 15 has a recess, which overlays a silicon submount 17. A LED chip 10 is flip chip mounted on the submount 17 inside the recess. The submount 17 has printed wirings on it, to which the exposed sections of the lead frames 18 and 19 are soldered with Pb/Sn solder paste, forming connections to the two bottom electrodes of the LED chip 10 without bonding wire. The LED chip 10 is covered with silicon glue 21 to fill the space between the lens 22 and the LED chip 10. Other back-filling material such as epoxy, glass, Teflon are also applicable, so long as the refractive index is greater than 1.3 and the transmission coefficient is greater than 80%. Since the structure does not use wire bonding, the thermal resistance is low and the reliability is high FIG. 6 shows a second embodiment of the present invention. A metal sheet is punched out by a press into two lead frames for positive lead 18 and negative common lead 19. The lead frames are exposed inside the cavity of the mold 15. The bottom of the mold 15 has an opening, which overlays an aluminum oxide submount 17. The submount 17 has printed wirings, to which the lead frames 18 and 19 are soldered with solder paste, forming connections to the two bottom electrodes of the LED chip 10 without wire bonding. The LED chip 10 is covered with silicon glue to form wireless bonding with low thermal resistance and high reliability. Other back-filling material such as epoxy, glass, Teflon may also be used, so long as the refractive index is greater than 1.3 and the transmission coefficient is greater than 80%.

Figure 7:
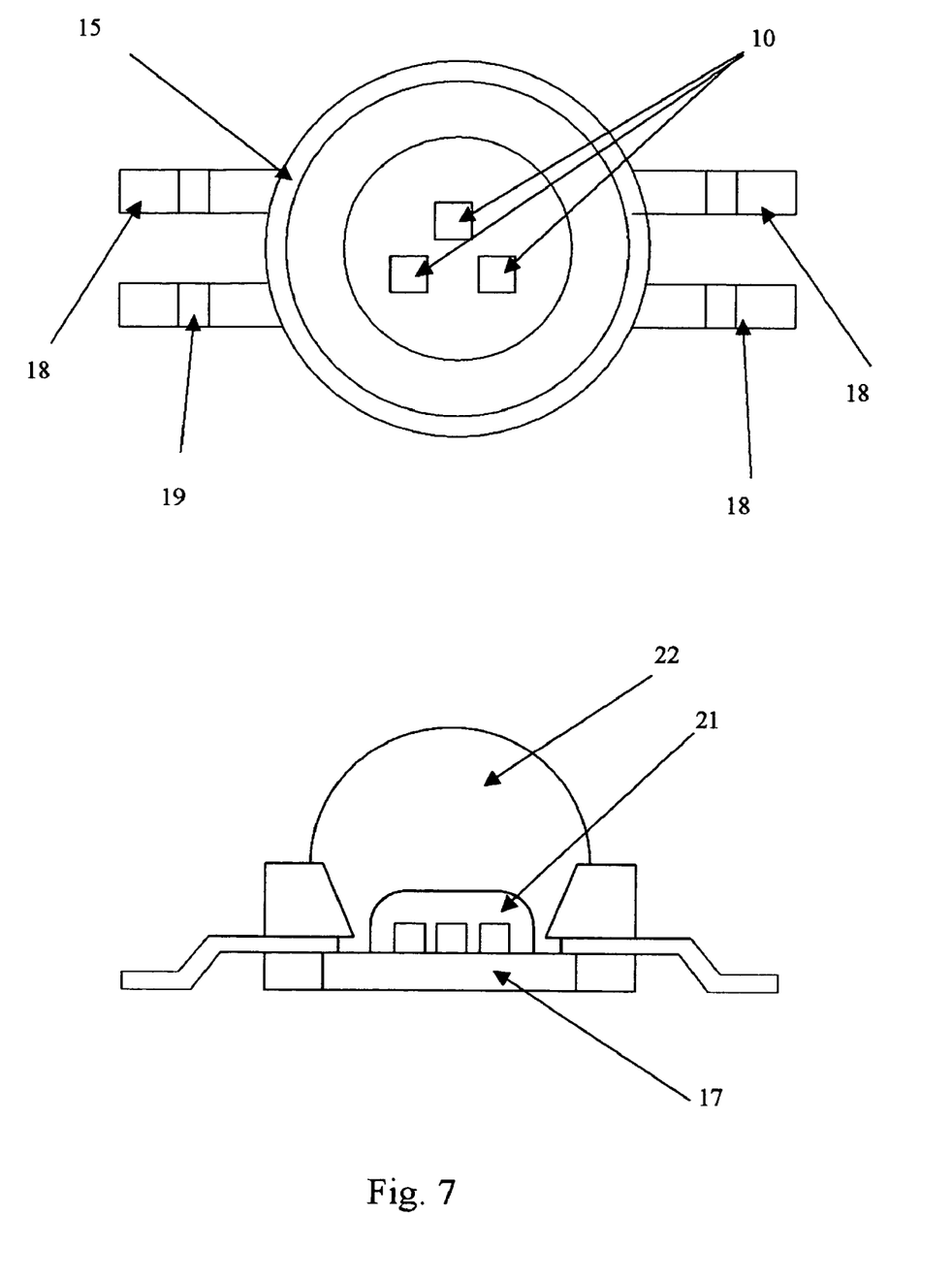
FIG. 7 shows a third embodiment of a LED package of the present invention.

FIG. 7 shows a third embodiment of the present invention. A metal sheet is punched out by a press as three positive terminal lead frames and one common negative terminal lead frame. These lead frames are imbedded in insulating mold 15 by means of injection molding. The three positive terminal lead frames 18 and the negative terminal lead frame 19 have exposed sections without insulating covering. A transparent lens 22 is mounted on top of the cavity of the mold 15 using transfer molding. The lens should have a transmission coefficient greater than 70% at a wavelength of 550 nm. The bottom of the mold 15 has a recess, which overlays a silicon submount 17. Three LEDs for emitting red, green and blue lights are mounted on the submount 17 and housed inside the recess. The submount has printed wirings, to which the exposed sections of the lead frames 18 and 19 are soldered, forming connections without wire bonding. The LED chips are covered with silicon glue to form wireless bonding with low thermal resistance and high reliability. Other back-filling material such as resi, glass, Teflon may also be used so long as the refractive index is greater than 1.3 and the transmission coefficient is greater than 80%.

Figure 8:
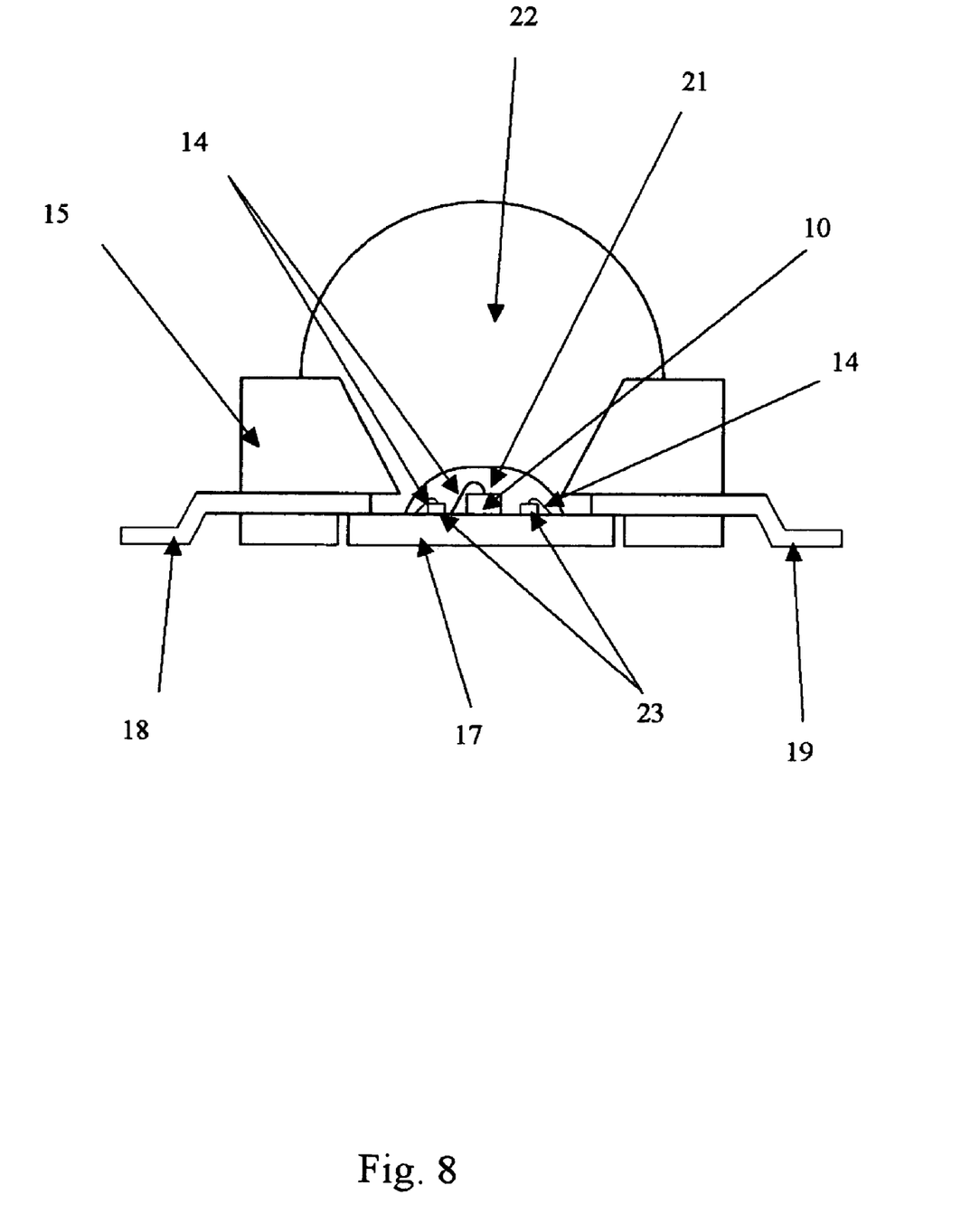
FIG. 8 shows a fourth embodiment of a LED package of the present invention.

FIG. 8 shows a fourth embodiment of the present invention. A metal sheet is punched out by a press into three positive leads 18 and a common negative lead 19 of three LED chips as shown in FIG. 7. The structure is similar to FIG. 7, except that two back-to-back Zener diodes 23 are connected each in parallel with the blue LED chip 10s. Other parts with the same reference numerals refers to the same corresponding parts in FIG. 7. Each of the three chips has a top electrode and a bottom electrode. The submount 17 is a metal cavity printed circuit board (MCPCB), to which the top electrodes of the three diodes are attached to the wires on the submount 17. Since the Zener diodes are normally reversed biased, no power is consumed by the Zener diodes, but offers protection to the LEDs. The above preferred embodiments are only examples for a better understanding of this invention and not used to limit the right scope of this invention. Any obvious modification to the embodiments and the right scope described in the claims below are all the right covered by the invention.

The invention claimed is:

1. A light emitting diode (LED) package, comprising:
a metallic lead frame having positive lead portion and negative lead portion insulated from one another;
a mold of insulating material wrapped over said metallic lead frame, having a cavity where sections of said metallic lead portions are not covered on bottom side surfaces by said insulating material;
an optical lens formed over said cavity to combine with said mold;
at least one LED chip flip-chip bonded on a submount away from the path of the light emission which has printed circuit printed on the same surface as said chip is mounted to couple said LED chip with said metallic lead portions through electrical coupling to said bottom surfaces; and transparent material having an index of refraction greater than 1.3 and a transmission coefficient greater than 80% filling the space between the lens and the LED chip.

2. The LED package as described in claim 1, wherein the material for said submount is selected from the group consisting of silicon, metal, composite metal, ceramic, aluminum nitride.

3. The LED package as described in claim 1, wherein said lens has a transmission coefficient of greater than 70% for a wavelength of 550 nm, and is composed of material selected from the group consisting of optical glue, epoxy, glass, silicon glue and Teflon.

4. The LED package as described in claim 1, wherein said transparent material is selected from the group consisting of plastic, epoxy, glass, and silicon gel.

5. The LED package as described in claim 1, wherein either said positive lead portion or said negative lead portion is more than one.

6. The LED package as described in claim 1, wherein said submount is more than one.

7. The LED package as described in claim 1, further comprising a circuit of electrostatic destruction protection (ESD) circuit.

* * * * *